United States Patent
Guitard et al.

(10) Patent No.: US 10,908,243 B2
(45) Date of Patent: Feb. 2, 2021

(54) NMR SPECTROSCOPY SYSTEM

(71) Applicant: COMMISSARIAT A L'ENERGIE ATOMIQUE ET AUX ENERGIES ALTERNATIVES, Paris (FR)

(72) Inventors: Pierre-André Guitard, Amilly (FR); Claude Fermon, Orsay (FR); Myriam Pannetier-Lecoeur, Bures sur Yvette (FR); Guénaëlle Jasmin-Lebras, Gif sur Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 135 days.

(21) Appl. No.: 16/081,632

(22) PCT Filed: Feb. 28, 2017

(86) PCT No.: PCT/FR2017/050448
§ 371 (c)(1),
(2) Date: Jan. 22, 2019

(87) PCT Pub. No.: WO2017/149239
PCT Pub. Date: Sep. 8, 2017

(65) Prior Publication Data
US 2019/0137584 A1  May 9, 2019

(30) Foreign Application Priority Data
Mar. 1, 2016  (FR) .......................... 16 51718

(51) Int. Cl.
*G01R 33/46* (2006.01)
*G01R 33/09* (2006.01)
(Continued)

(52) U.S. Cl.
CPC ........... *G01R 33/46* (2013.01); *G01R 33/091* (2013.01); *G01R 33/093* (2013.01);
(Continued)

(58) Field of Classification Search
CPC ...... G01R 33/46; G01R 33/381; G01R 33/32; G01R 33/3621; G01R 33/3815;
(Continued)

(56) References Cited

U.S. PATENT DOCUMENTS 6,161,032 A * 12/2000 Acker ..................... A61B 5/06
324/207.11
7,432,714 B2  10/2008 Prins
(Continued)

FOREIGN PATENT DOCUMENTS

| EP | 1 991 862 A1 | 11/2008 |
| FR | 2 876 800 A1 | 4/2006 |
| WO | WO 2007/095971 A1 | 8/2007 |

OTHER PUBLICATIONS

International Search Report as issued in International Patent Application No. PCT/FR2017/050448, dated Jul. 11, 2017.
(Continued)

*Primary Examiner* — Farhana A Hoque
(74) *Attorney, Agent, or Firm* — Pillsbury Winthrop Shaw Pittman LLP

(57) ABSTRACT

An NMR spectroscopy system for studying a region of a sample to be analysed, includes a magnetoresistive transducer made up of superposed planar layers, which receives a response signal of the sample; a system for making an AC current flow, at a supply frequency $f_c$, through the transducer; a system for generating a magnetic field $H_0$ that is constant and uniform throughout a zone of interest in which the sample and transducer are placed; and an exciting coil to generate a magnetic field $H_1$ that is uniform throughout the (Continued)

zone of interest and that varies at a resonant frequency $f_1$; the field $H_0$ is substantially perpendicular to the layers of the transducer. The system further includes a regulating system to ensure that the field $H_0$ and the planar layers remain orthogonal, and a system for detecting a signal of frequency $f_c-f_1$, $f_1-f_c$ or $f_c+f_1$.

10 Claims, 6 Drawing Sheets

(51) Int. Cl.
| | |
|---|---|
| *G01R 33/30* | (2006.01) |
| *G01R 33/36* | (2006.01) |
| *G01R 33/32* | (2006.01) |
| *G01R 33/381* | (2006.01) |
| *G01R 33/3815* | (2006.01) |

(52) U.S. Cl.
CPC ......... *G01R 33/098* (2013.01); *G01R 33/302* (2013.01); *G01R 33/32* (2013.01); *G01R 33/3621* (2013.01); *G01R 33/381* (2013.01); *G01R 33/3815* (2013.01)

(58) Field of Classification Search
CPC .. G01R 33/091; G01R 33/302; G01R 33/098; G01R 33/093
USPC ........................................................ 324/307
See application file for complete search history.

(56) References Cited

U.S. PATENT DOCUMENTS

| | | | |
|---|---|---|---|
| 2007/0222433 A1 | 9/2007 | Tiernan et al. | |
| 2010/0264917 A1* | 10/2010 | Budker | B82Y 25/00 |
| | | | 324/307 |

OTHER PUBLICATIONS

Guitard, P.-A., et al., "Local nuclear magnetic resonance spectroscopy with giant magnetic resistance-based sensors," Applied Physics Letters, vol. 108, No. 21, May 2016, XP012208031, pp. 212405-1-212405-4.

Pannetier-Lecoeur, M., et al., "Low noise magnetoresistive sensors for current measurement and compasses," Journal of Magnetism and Magnetic Materials, vol. 316, No. 2, Jun. 2007, XP022120307, pp. e246-e248.

Pannetier, M., et al., "Femtotesla Magnetic Field Measurement with Magnetoresistive Sensors," American Association for the Advancement of Science, vol. 304, No. 5677, Jun. 2004, XP002423293, pp. 1468-1650.

Sinibaldi, R., et al., "NMR Detection at 8.9 mT With a GMR Based Sensor Coupled to a Superconducting Nb Flux Transformer," Progress in Electromagnetics Research, vol. 142, Sep. 2013, XP055311935, pp. 389-408.

Guitard, P.-A., "Local Nuclear Magnetic Resonance Spectroscopy with Giant Magnetoresistive Sensors," PhD Thesis, Dec. 2015, XP055311944, Retrieved from the Internet: URL: https://tel.archives-ouvertes.fr/tel-01303378/document; Retrieved on Oct. 18, 2016, 168 pages.

\* cited by examiner

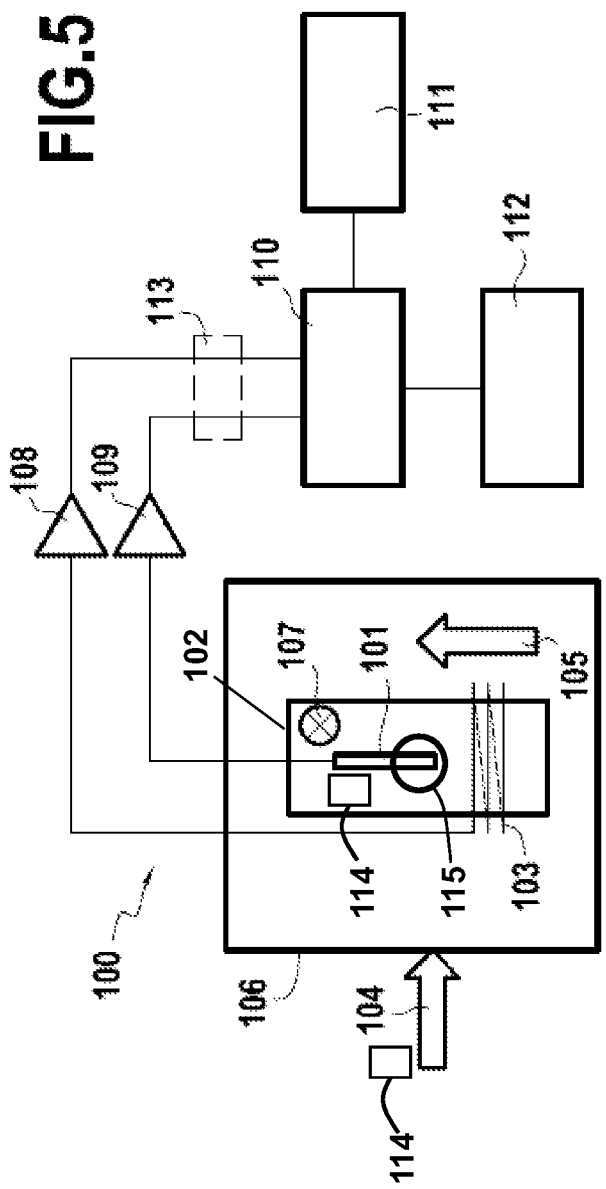

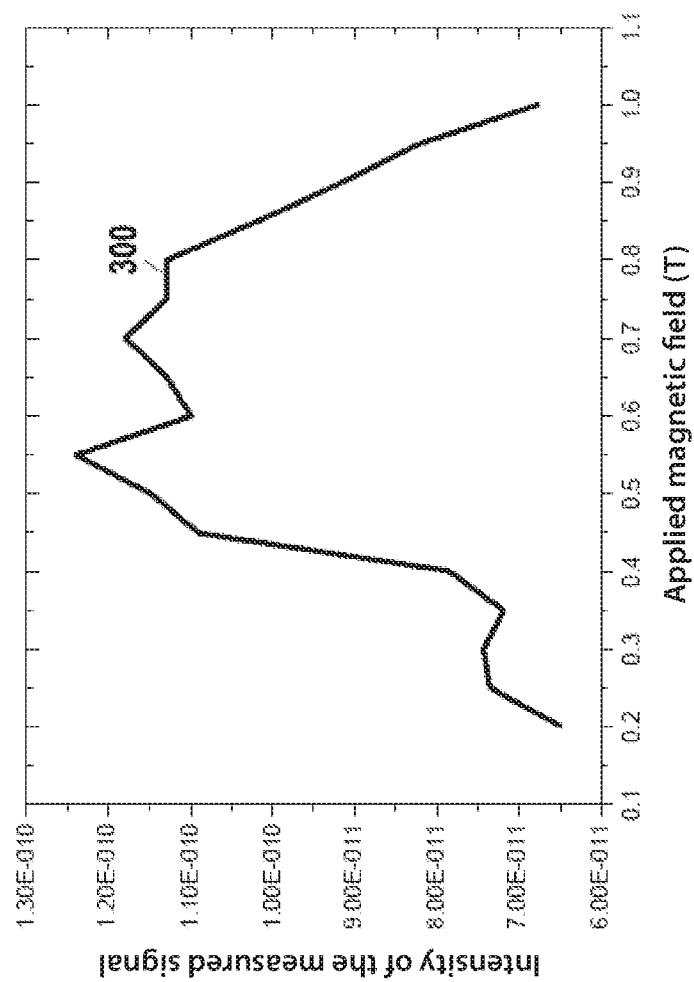

NMR SPECTROSCOPY SYSTEM

CROSS-REFERENCE TO RELATED APPLICATIONS

This application is the U.S. National Stage of PCT/FR2017/050448, filed Feb. 28, 2017, which in turn claims priority to French Patent Application No. 1651718 filed Mar. 1, 2016, the entire contents of all applications are incorporated herein by reference in their entireties.

FIELD OF THE INVENTION

The present invention relates to the use of a magnetoresistive type sensor for nuclear magnetic resonance (NMR) spectroscopy at the local scale. Magnetoresistive sensors cover giant magnetoresistance (GMR) sensors and tunnel magnetoresistance (TMR) sensors, but the method may be extended to any magnetoresistive type magnetic field sensor having both sufficient sensitivity and a micronic size. The main applications of this invention are, on the one hand, local spectroscopy of a small volume of fluid confined in a microfluidic channel for example and, on the other hand, carrying out local in vivo spectroscopy.

PRIOR ART

At present, nuclear magnetic resonance (NMR) spectroscopy is very widely used in chemistry and biology for the analysis of molecules, because it makes it possible to provide information on the distances between atoms and on the environment of each atom having spin. Numerous commercially available devices working in very strong magnetic fields are proposed by different companies such as for example Brucker SA. The principle of all these devices is to carry out a detection of the NMR signal using a coil tuned to the resonance frequency of the corresponding nucleus. A tuned coil is, at high frequency, the most sensitive known magnetic sensor. However, it contains an important intrinsic limitation which is its size, for which it is difficult to descend below 200 or 300 µm diameter.

Furthermore, the GMR (giant magnetoresistive) effect and the TMR (tunnel magnetoresistive) effect are observed in thin metal films composed of layers of ferromagnetic and non-ferromagnetic materials. These effects manifest themselves by an important variation in the electrical resistance of these structures in the presence of a magnetic field. The normal configuration of a magnetoresistance is a spin valve composed of a hard layer (of which the magnetisation is insensitive to the applied magnetic field) and of a free layer (of which the magnetisation is sensitive to the applied magnetic field). Each of these layers is formed of a plurality of magnetic and non-magnetic layers. The resistance of this system changes as a function of the angle between the magnetisation vector of the hard layer and the magnetisation vector of the free layer. In the case of GMRs, the two layers are separated by a metal layer and the measurement contacts can be taken on top of the set of layers. In the case of TMR, the two layers are separated by an insulating layer and the measurement contacts are taken below and above the set of layers.

A certain number of groups have tried to use magnetoresistive sensors for detecting NMR signals.

The patent US2007/0222433 (T. Tiernan and J. C. Ford) describes an array of sensors of AMR (anisotropic magnetic resonance) type for magnetic resonance imaging (or MRI) either alone or combined with a conducting loop similar to the patent FR2876800 A1. These approaches make it possible to attain millimetric detection resolutions.

The U.S. Pat. No. 7,432,714 proposes the use of GMRs or TMRs for microfluidic channels with very local excitation but does not propose any solution making it possible to work at quite strong fields.

The patent US2010/0264917 circumvents the problem of the strong field by using a remote pre-polarisation magnet. This solution, which makes it possible to retain the sensitivity of the sensor, does not make it possible to carry out high resolution spectroscopy, the measurement field being weak.

Subject Matter and Brief Description of the Invention

There exists an important need today to be able to carry out local NMR spectroscopy and notably on all small volumes of liquids, in particular in microfluidic systems, or to carry out local spectroscopy in the case of in vivo measurements. None of these known solutions enables these measurements to be carried out efficiently.

The aim of the invention is to propose an alternative approach to existing solutions and which makes it possible to measure an NMR signal while working in a very strong field and while retaining sufficient detection sensitivity to be able to carry out local spectroscopy with good spatial resolution.

To this end the invention describes an NMR spectroscopy system for studying at least one region of a sample to be analysed, said system including:
- a magnetoresistive transducer with superimposed planar layers receiving a response signal from said sample;
- means suitable for making an AC current flow, at a supply frequency $f_c$, through said transducer;
- means for generating a magnetic field $H_0$ that is constant and uniform throughout a zone of interest in which the sample and the transducer are placed;
- an exciting coil configured to generate a variable magnetic field $H_1$ that is uniform throughout said zone of interest at a resonance frequency $f_1$ configured to excite the sample;

said system being characterised in that
- the field $H_0$ is substantially perpendicular to the planar layers of the transducer;
- the system further comprises:
  - regulating means suited to ensure orthogonality between the field $H_0$ and the planar layers of the transducer, said regulating means being laid out to modify the inclination of the transducer and/or the direction of the field $H_0$;
  - means for detecting signals of frequency $f_c-f_1$, $f_1-f_c$ or $f_1+f_c$, said signals being coherent and in phase with the signal at the supply frequency $f_c$ and the signal at the resonance frequency $f_1$.

Magnetoresistive transducer is taken to mean a GMR or TMR type device.

Alternating current at a supply frequency $f_c$ is taken to mean the signal that supplies the magnetoresistive transducer.

Resonance frequency $f_1$ is taken to mean a resonance frequency of the atomic nuclei present in the sample. More precisely, the frequency $f_1$ is the Larmor frequency of the atomic nuclei placed in the field $H_0$. This frequency is linked to the energy necessary for the inversion of the spins of the atomic nuclei oriented by the field $H_0$ and it is characteristic both of the chemical species that form the sample and of the applied field. The Larmor frequency is for example 42.578 MHz for hydrogen in a field of 1 Tesla.

The signals of frequency $f_1$ and $f_c$ are generated so as to be coherent and in phase with each other. This is necessary so that the sum $(f_1+f_c)$ or difference $(f_c-f_1, f_1-f_c)$ signals are well defined and detectable during the measurement.

The approach proposed by the invention is based on magnetoresistive sensors based on spintronics with a configuration that makes it possible to retain high sensitivity in the presence of a strong external magnetic field and makes it possible by mixing frequencies in situ to have a purely local measurement.

Indeed, a spectroscopy method today requires having a resolution of 0.2 ppm of the main field, that is to say taking into account the width of the natural ray of the signals which is 1 Hz in microfluidic channels and 10 Hz in in vivo configurations for the hydrogen signal, minimum working frequencies of 5 MHz in channels and 50 MHz in vivo. This corresponds to magnetic fields between 0.1 and 1.1 Tesla.

Advantageously, the system detects sum frequency $(f_1+f_c)$ or difference frequency $(f_c-f_1$ or $f_1-f_c)$ signals. This frequency mixture is realised at the level of the magnetoresistive transducer: the resistance of the transducer varies as $f_1$ (depending on the response of the spins of the atomic nuclei) and the current that flows through it varies as $f_c$. The voltage detected thus contains components at the sum and at the difference frequencies. This ensures that the signal detected is effectively local and coming from the region of the sample probed by the transducer.

It is usual to think that a GMR cannot operate in planar fields greater than several mT on account of its saturation at these fields.

Yet the application considered uses fields of the order of 0.5 T, even being able to go up to 1 T.

The invention manages to overcome this problem of saturation by applying the ambient field in a plane perfectly perpendicular to the plane of the GMR, thanks to the use of regulation means suited to ensure orthogonality between the field $H_0$ and the planar layers of the transducer. The precision of the perpendicularity must be such that the residual component of the field in the plane is less than the planar saturation of the GMR. For sensitive GMRs, this value is typically of the order of 1 mT. In addition, GMR sensors formed of thin and well compensated magnetic layers is essential to be able to retain a sufficient planar sensitivity at 1 Tesla.

By using for example a measurement field of 0.5 T, it is thus necessary to have an alignment of angle in radians better than $1/500$.

To this end, the invention uses means for regulating the position and/or the inclination of the magnetoresistive transducer and/or the direction of the field $H_0$ to ensure orthogonality between the field $H_0$ and the planar layers of the transducer.

This configuration found by the Inventors makes it possible to retain the sensitivity of the GMR in the plane and is thus suited to detecting a signal created by the nuclei to be detected.

A degraded sensitivity still exists for an angular displacement going up to ±1 degree with respect to the perpendicular, but beyond this value, its exploitation no longer has an interest.

Advantageously, the size of the magnetoresistive transducer is chosen as a function of the dimension of the region of interest of the sample to be analysed so as to carry out local NMR spectroscopy.

This is possible thanks to the fact that in frequencies corresponding to spectroscopy by nuclear magnetic resonance, the GMR or TMR is going to have a sensitivity independent of the frequency and the size of the object. In addition, the signal created by 1 $\mu m^3$ measured at 1 $\mu m$ is identical to the signal created by 1 $mm^3$ measured at 1 mm.

For this reason, it is possible, thanks to the magnetoresistive approach, to measure extremely small volumes without losing sensitivity of the signal. Extremely small is taken to mean less than one mm and which can go up to several $\mu m$, for example around ten or so $\mu m$. It may even be envisaged, in particular with TMRs, to reach sizes of 20 nm.

The system according to the invention may also have one or more of the characteristics below, considered individually or according to all technically possible combinations thereof:
  the dimension of the magnetoresistive transducer is chosen as a function of the dimension of the region of interest of the sample to be analysed;
  said regulation means are further laid out to modify the position of the transducer;
  the transducer with superimposed planar layers is a giant magnetoresistance GMR or tunnel magnetoresistance TMR element;
  the regulating means to ensure orthogonality between the field $H_0$ and the planar layers of the transducer include at least one test coil generating a magnetic field $H_T$, said field $H_T$ being perpendicular both to the field $H_0$ and to the field $H_1$;
  the regulating means to ensure orthogonality between the field $H_0$ and the planar layers of the transducer include systems for micrometric regulation of the position and the inclination of the transducer and the direction of the field $H_0$.
  the sample to be analysed is constituted of the biological tissues of an animal or of a subject and the transducer is produced on a needle-shaped support;
  the sample to be analysed is constituted of a liquid arranged in a microfluidic channel and in that the transducer is produced in the form of a set of individual sensors arranged above or below the microfluidic channel over the whole width of this microfluidic channel, the planar dimensions of the set of individual sensors being substantially equal to the planar dimensions of the microfluidic channel;
  the system according to the invention includes a shielded enclosure in which the global exciting coil, the sample to be analysed and the transducer are placed, and in that it includes a permanent magnet, electromagnetic coils or a superconducting magnet placed outside of the shielded enclosure to create said permanent ambient magnetic field $H_0$;
  the sensitive magnetoresistive transducer has a C-shape or meander-shape and is connected to the two contacts.

The present application also relates to a method for implementing the NMR spectroscopy system, said method including the following steps:
  generating a magnetic field $H_0$ that is constant and uniform throughout the zone of interest in which the sample to be analysed and the transducer are placed;
  regulating the inclination and/or the position of the transducer and the direction of the field $H_0$ to obtain orthogonality between $H_0$ and the plane of the layers of the transducer, said regulation being carried out using:
    the test coil generating a field $H_T$, said field $H_T$ being perpendicular both to $H_0$ and to $H_1$;

the means for regulating the inclination of the transducer and/or the direction of the magnetic field $H_0$;

generating the variable field $H_1$ that is uniform throughout the zone of interest in which the sample and the transducer are placed;

detecting signals of frequency $f_c-f_1$, $f_1-f_c$ or $f_c+f_1$, said signals being coherent and in phase with the signal at the supply frequency $f_c$ and the signal at the resonance frequency $f_1$.

BRIEF DESCRIPTION OF THE DRAWINGS

Other characteristics and advantages of the invention will become clear from the following description of particular embodiments, given as examples, with reference to the appended drawings, in which:

FIG. 5 is a schematic view of a possible particular embodiment of a complete configuration in which the means for generating the field $H_0$ are not represented because obvious for those skilled in the art or included in an NMR spectrometer; only the direction 104 of this field is represented.

FIG. 6 is a curve giving the intensity of the signal measured as a function of the magnetic field applied in the case of an optimised GMR sensor.

DETAILED DESCRIPTION OF PARTICULAR EMBODIMENTS

According to one preferential embodiment, the transducer or sensor with superimposed planar layers used in the present invention is a giant magnetoresistance (GMR) or tunnel magnetoresistance (TMR) element.

One advantage of this embodiment is the possibility of using magnetoresistive elements having both great measurement sensitivity and reduced size, suited to local NMR measurements.

Figure 1:
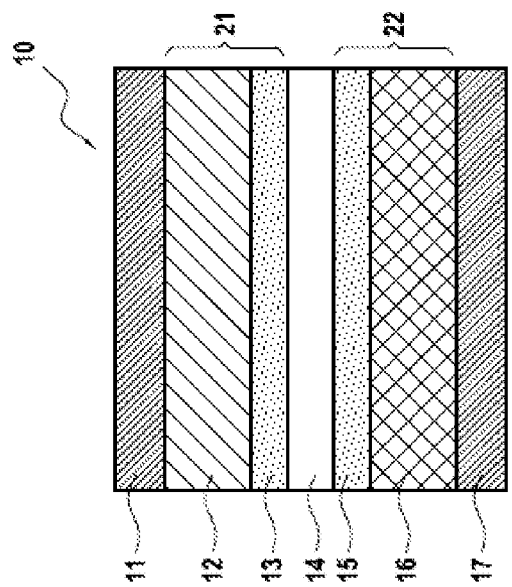
FIG. 1 is a schematic sectional view showing as an example the elements constituting a GMR or TMR spin valve type magnetoresistive sensor.

FIG. 1 shows an example of representation of an assembly of thin films that constitutes a GMR type magnetoresistive sensor 10 having the structure of a spin valve.

Such a spin valve typically contains a hard or blocked layer 22, that is to say a layer not very sensitive to the external magnetic field, and a soft or free layer 21, very sensitive to the magnetic field, that is to say of which the magnetisation is oriented very easily in an external field applied in the plane of the layer.

The hard layer 22 may be formed either of an assembly of ferromagnetic layers having high coercivity, or of a mixture of antiferromagnetic layers, artificial or not, coupled to a ferromagnetic layer.

The soft layer 21 is formed of very soft magnetic materials.

As an example, the magnetoresistive sensor 10 of FIG. 1 may include, from the free surface, a tantalum protection layer 11, a soft magnetic layer 21 comprising a NiFe layer 12 and a CoFe layer 13. This soft layer 21 is oriented in the direction of the external magnetic field. The thickness of the layer must be such that the layer sufficiently resists the external magnetic field but is sufficiently thin to ensure good sensitivity of the GMR or TMR. A thickness of 5 nm of NiFe and 2 nm of CoFe are values that are suitable for working up to 1 Tesla.

A hard magnetic layer 22 is separated from the soft layer 21 by a copper separating layer 14. The hard magnetic layer 22 may include, from the separating layer 14, a CoFe layer 15 and a PtMn layer 16. The hard layer 22 has a direction of magnetisation—in general in the plane of the layer—that is set during manufacture. Alternatively, the layer 16 may contain PtMn and a CoFe/Ru bilayer with 0.8 nm of Ru. The CoFe/Ru/CoFe trilayer thereby formed is an artificial antiferromagnetic that is much more robust with respect to the application of a perpendicular field.

A layer 17 of tantalum, ruthenium, NiFe or NiFeCr can serve as growth precursor of upper layers 16, 15, 14, 13, 12 and 11 added successively for the implementation of the circuit.

The set of these layers is deposited by techniques specific to the manufacture of thin films (cathodic sputtering, evaporation, etc.) on a crystalline (silicon, sapphire, etc.) or amorphous (glass, quartz) or instead ceramic substrate. However the use of a strong field, typically greater than 0.1 T and thus implying resonance frequencies for the proton greater than 5 MHz, requires a very insulating substrate, and in this respect cannot accept even pure silicon. The use of glass, quartz or sapphire as substrate then becomes necessary. The substrate, below the seeding layer 17, is not represented in FIG. 1.

As an example, the assembly of the layers of FIG. 1 may have a thickness of around 30 nm.

Numerous stacks currently published in the technical literature could be suitable and notably spin valves with an artificial ferromagnetic material.

As explained in the publication "Low noise magnetoresistive sensors for current measurement and compasses" Pannetier-Lecoeur, M; Fermon, C; de Vismes, A, et al. JOURNAL OF MAGNETISM AND MAGNETIC MATERIALS, Volume: 316, Issue: 2, Pages: E246-E248, Published in 2007, the use of C-shaped sensors makes it possible to reduce greatly low frequency magnetic noise. This shape may be generalised as short-circuited meanders, which makes it possible to have a square or rectangular measurement zone. In the case of the targeted application, the working frequency is high, between 5 MHz and 50 MHz, and thus low frequency noise is not a limit.

Figure 2:
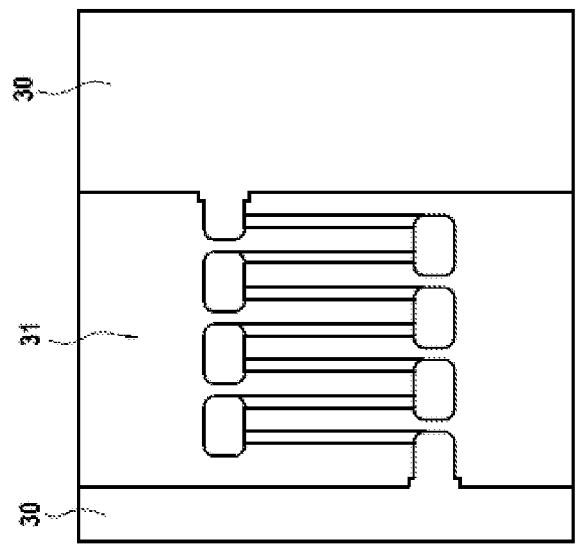
FIG. 2 is a view of the form of a GMR type magnetoresistive sensor that makes it possible to obtain a homogeneous measurement on a given volume with good sensitivity while having good immunity to an intense field and perpendicular to the plane of the layers.

FIG. 2 shows a preferential configuration which makes it possible to measure the resonance signal on a volume of 30×30×30 µm³. The sensitive GMR element 31 has a meander shape and is connected to the two contacts 30 which constitute a coaxial line of which the impedance is adapted to the resistance of the magnetoresistive meander.

This preferential configuration is well suited for measurements in vivo or immersed in a liquid or instead well suited to a microfluidic channel 30 µm wide.

According to one embodiment, the dimension of the transducer 101 is chosen as a function of the dimension of the region of interest of the sample to be analysed.

One advantage of this embodiment is to be able to carry out local NMR spectroscopy and to choose the dimension of the region of the sample to be analysed thanks to a transducer 101 of suitable dimension.

Figure 3:
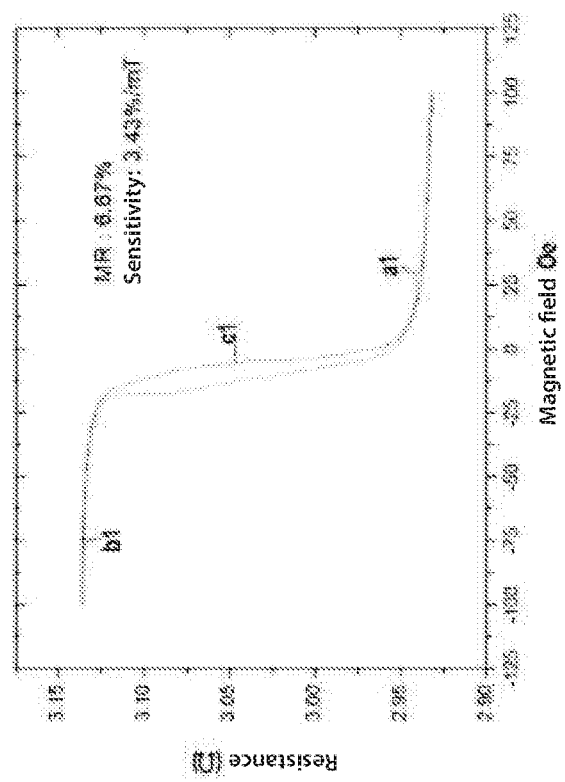
FIG. 3 shows a typical response curve of a GMR type sensor, such as for example that of FIG. 1, in the presence of a longitudinal polarisation field.

FIG. 3 shows a typical response (output voltage) of a spin valve when the resistance is measured as a function of the field H applied in the plane of the layers composing the GMR, and the presence of a main external field having a residual longitudinal component of 2 mT.

Such a curve has a high saturation plateau (section b1), a working zone (section c1) with a quasi-linear evolution and a low saturation plateau (section a1).

Complementary information concerning such a typical curve of a GMR type sensor may be found for example in the document FR 2876800 A1.

To maximise the sensitivity of the magnetoresistive transducer 101 and to avoid saturation effects, the constant and uniform field $H_0$ must be perpendicular to the plane of the layers of the transducer 101. To ensure orthogonality between $H_0$ and the plane of the layers, the NMR spectroscopy system 100 according to the invention comprises regulating means 114.

According to one embodiment, the regulating means 114 to ensure orthogonality between the field $H_0$ 104 and the planar layers of the transducer 101 include at least one test coil 115 generating a magnetic field $H_T$, said field $H_T$ being perpendicular both to the field $H_0$ and to the field $H_1$.

One advantage of this embodiment is to generate a test magnetic field $H_T$ directed along the direction 107 and used for the preliminary regulations to the NMR measurements. More particularly, by modifying the inclination of the transducer 101 and/or the direction of the field $H_0$, orthogonality between the field $H_0$ and the planar layers may be achieved while maximising the sensitivity of the transducer 101 with respect to the test magnetic field $H_T$. According to one embodiment of the invention, the means for regulating between the field $H_0$ and the planar layers of the transducer 101 include systems for micrometric regulation 114 of the position and the inclination of the transducer 101 and the direction of the field $H_0$.

One advantage of this embodiment is to provide micrometric regulations to ensure orthogonality between $H_0$ and the planar layers of the transducer 101, which makes it possible to eliminate efficiently problems of saturation of the magnetoresistive transducer due to the presence of a component of the field $H_0$ in the plane of the layers, while maximising the sensitivity of the transducer 101. The micrometric regulation systems may be, for example, micrometric screws.

According to one embodiment of the invention, the sample is constituted of a liquid arranged in a microfluidic channel 46 and the transducer 101 is realised in the form of a set of individual sensors 41 arranged below or above the microfluidic channel 46 over the whole width of the microfluidic channel 46, the planar dimensions of the set of individual sensors 41 being substantially equal to the planar dimensions of the microfluidic channel 46.

Figure 4B:
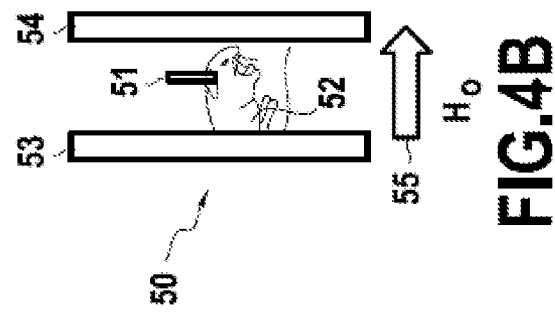
FIGS. 4A and 4B are schematic views of configurations of a device respectively in the case of a measurement on a micro-fluidic channel and in the case of an in vivo measurement.
Figure 4A:
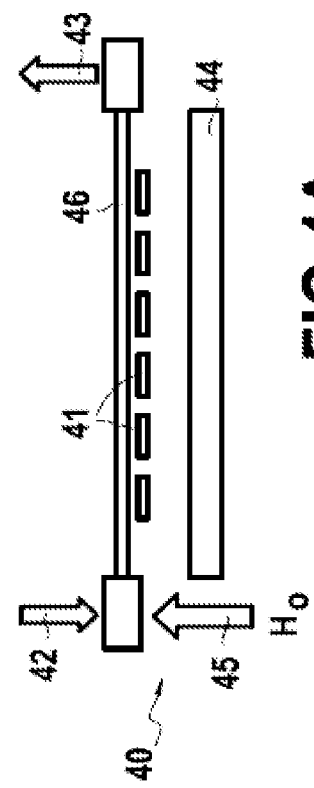

This embodiment is represented in FIG. 4A, which shows a configuration of GMR measurement device 40 well suited to an NMR spectroscopy measurement in the case of a liquid contained in a microfluidic channel 46 having a fluid input 42 and a fluid output 43. The planar dimensions (width*length) of the sensor constituted of a plurality of elementary magnetic sensors 41 then have to, in an optimal manner, correspond to the planar dimensions of the channel 46. The sensitivity axis is then situated in the plane and perpendicular to the channel 46. The main magnetic field $H_0$ represented by the arrow 45 and created by the magnet 44 is then applied perpendicular to the plane of the GMR.

One advantage of this configuration is that the probed volume is limited to the dimensions of the channel 46/microprobe 41 assembly, of micronic sizes, and the homogeneity required for the main field $H_0$ is easily attainable by comparison with the homogeneity necessary for the MRI.

According to one embodiment of the invention, the sample to be analysed is constituted of the biological tissues of an animal or of a subject 52 and the transducer 51 is produced on a needle-shaped support.

This embodiment is represented in FIG. 4B, which shows a configuration of measurement device with GMR 50 well suited to a local in vivo measurement. A homogeneous main field $H_0$ symbolised by the arrow 55 and created by an electromagnet 53, 54 is applied perpendicularly to the magnetoresistive sensor 51. The sensor 51 is produced on an insulating substrate cut to have a width as close as possible to that of the sensor and a sufficiently small thickness in the case of in vivo measurements in order to be able to penetrate into the tissues of the animal or of the subject 52 without significant damage. This device will be designated by the term microprobe in the remainder of the description.

One advantage of this embodiment is to be able to carry out NMR measurements on biological tissues in vivo.

According to one embodiment of the invention, the system 100 includes a shielded enclosure 106 in which the exciting coil 103, the sample to be analysed 102 and the transducer 101 are placed, and it further includes a permanent magnet or electromagnetic coils placed outside of the shielded enclosure 106 to create said uniform permanent ambient magnetic field $H_0$.

This embodiment is represented in FIG. 5, which shows a block diagram of an example of measuring device according to the invention. The resonance of the total volume of the sample 102 is measured with a large size resonance coil 103 which also serves as exciting coil making it possible to create a rotation of the spins and to trigger their precession. The microprobe 101, associated with the sample 102 and of which the direction of sensitivity is represented by the direction 107, is connected to a preamplifier 109 and its signal is recorded on the NMR spectrometer 110 in parallel with the signal coming from the preamplifier 108 associated with the resonance coil 103. The spectrometer 110 may be associated with an oscilloscope 111 and with a computer 112.

A screen 106 shielding against alternating magnetic fields, but allowing continuous fields to get through, surrounds the sample 102.

Advantageously, the shield screen 106 eliminates potential oscillating parasitic signals which can pollute the NMR measurements.

In FIG. 5, the arrow 104 represents the main external magnetic field $H_0$, constant and homogeneous, which is perpendicular to the microprobe 101, and the arrow 105 represents the magnetic field $H_1$, variable and homogeneous, applied by the exciting coil 103.

One method for implementing the system 100 according to the invention comprises the following steps:
  generating a magnetic field $H_0$ that is constant and uniform throughout a zone of interest in which the sample (102) to be analysed and the transducer (101) are placed;
  regulating the position and/or the inclination of the transducer 101 and the direction of the field $H_0$ to obtain orthogonality between $H_0$ and the plane of the layers of the transducer 101, said regulation being carried out using:

the test coil 115 generating a field $H_T$, said field $H_T$ being perpendicular both to $H_0$ and to $H_1$;

the means for regulating 114 the inclination of the transducer 101 and/or the direction of the magnetic field $H_0$;

generating the variable field $H_1$ that is uniform throughout the zone of interest in which the sample 102 and the transducer 101 are placed;

detecting signals of frequency $f_c-f_1$, $f_1-f_c$ or $f_c+f_1$, said signals being coherent and in phase with the signal at the supply frequency $f_c$ and the signal at the resonance frequency $f_1$.

Advantageously, this embodiment provides a step of regulation, necessary to ensure orthogonality between $H_0$ and the planar layers. This regulation is important for the correct operation of the device. This is explained by the fact that a small misalignment between $H_0$ and the normal to the planar layers produces a component of $H_0$ in the plane of the layers. The field $H_0$ being very intense, even a small misalignment may cause the saturation of the transducer 101.

A detailed description of particular modes for an in vivo measurement will be given below.

In the case of an in vivo measurement, the particular optimal embodiment consists in producing a sensor of small size, typically 20×20 pmt on a needle made of silicon or insulator material (glass, sapphire, ceramic), 50 to 100 μm wide and of small thickness, typically 50 μm. Furthermore, the needle has to have a pointed end in order to be able to penetrate easily into biological tissues without creating great damage.

The animal or the subject is placed in a main magnetic field such as that created by an MRI or a magnet and it is then necessary to adjust the position of the animal or the subject in such a way that the field is perpendicular to the plane of the sensitive element. Alternatively, the main field may be slightly turned with auxiliary coils creating fields perpendicular to the main field.

An NMR spectroscopy system is then connected. This system includes a global exciting coil which is situated around the animal or the subject and which also serves as global reception; and the magnetoresistive element, which is the detection element and which is then connected to the spectrometer.

In this configuration a direct coupling between the microprobe and the exciting coil may be observed. In order to be free of this signal contamination, an optional improvement consists in using the magnetoresistive element as in situ demodulator. As described in the patent document EP 1991862, the GMR element is supplied at a non-zero frequency $f_c$, the NMR signal is detected at a frequency $f_1$ which is also the frequency of contamination by the global exciting coil and the local detection takes place at a frequency $f_c-f_1$, $f_c-f_1$ or $f_1-f_c$. This in situ demodulation (symbolised by the reference 113 of FIG. 5) makes it possible to ensure that the spectroscopy measurement is indeed local.

The NMR spectroscopy is then carried out in a conventional manner.

A detailed description of particular embodiments for a measurement in a microfluidic channel will be given below.

The preferential configuration is then to have the sensor placed above or below the microfluidic channel with a width equal to the width of the latter. It is necessary to provide an RF excitation which creates a homogeneous signal over the size of the sensitive element. This may advantageously be carried out by a coplanar antenna that passes over or under the guide and the magnetoresistive element, either parallel to the guide, or perpendicular. By passing perpendicularly, the advantage is not to couple directly with the sensitive axis of the sensor. The sensitivity axis of the magnetoresistive element will be preferentially chosen perpendicular to the microfluidic channel.

The main field $H_0$ could be applied to the microfluidic/microprobe assembly via external coils or by a permanent magnet system. The required homogeneity applies to the volume delimited by the channel and the microprobe below/above.

The interfacing with the NMR spectrometer is done in the same way as in the case of the in vivo configuration. In the same way as in vivo, the in situ demodulation makes it possible to obtain an appreciable gain in signal to noise and to be free of different inductive couplings.

The invention claimed is:

1. NMR spectroscopy system for studying at least one region of a sample to be analysed, said system comprising:
    a magnetoresistive transducer with superimposed planar layers receiving a response signal from said sample;
    means suitable for making an alternating current flow, at a supply frequency $f_c$, through said transducer;
    means for generating a magnetic field $H_0$ that is constant and uniform throughout a zone of interest in which the sample and the transducer are placed;
    an exciting coil configured to generate a magnetic field $H_1$ that is uniform throughout said zone of interest and variable at a resonance frequency $f_1$ configured to excite the sample;
    wherein:
    said field $H_0$ is substantially perpendicular to the planar layers of the transducer;
    said system comprises:
        regulating means arranged to ensure orthogonality between the field $H_0$ and the planar layers of the transducer, said regulating means being laid out to modify an inclination of the transducer and/or a direction of the field $H_0$;
        means for detecting signals of frequency $f_c-f_1$, $f_1-f_c$ or $f_c+f_1$, said signals being coherent and in phase with the signal at the supply frequency $f_c$ and the signal at the resonance frequency $f_1$.

2. The NMR spectroscopy system according to claim 1, wherein a dimension of the transducer is chosen as a function of a dimension of the region of the sample to be analysed.

3. The NMR spectroscopy system according to claim 1, wherein the transducer with superimposed planar layers is a giant magnetoresistance or tunnel magnetoresistance element.

4. The NMR spectroscopy system according to claim 1, wherein the regulating means to ensure orthogonality between the field $H_0$ and the planar layers of the transducer include at least one test coil generating a magnetic field $H_T$, said field $H_T$ being perpendicular both to the field $H_0$ and to the field $H_1$.

5. The NMR spectroscopy system according to claim 1, wherein the regulating means to ensure orthogonality between the field $H_0$ and the planar layers of the transducer include systems for micrometric regulation of the position and the inclination of the transducer and the direction of the field $H_0$.

6. The NMR spectroscopy system according to claim 1, wherein the sample to be analysed is constituted of the biological tissues of an animal or of a subject and wherein the transducer is produced on a needle-shaped support.

7. The NMR spectroscopy system according to claim 1, wherein the sample to be analysed is constituted of a liquid arranged in a microfluidic channel and wherein the transducer is produced in the form of a set of individual sensors arranged above or below the microfluidic channel over the whole width of the microfluidic channel, the planar dimensions of the set of individual sensors being substantially equal to the planar dimensions of the microfluidic channel.

8. The NMR spectroscopy system according to claim 1, further comprising a shielded enclosure in which the exciting coil, the sample to be analysed and the transducer are placed, and a permanent magnet, electromagnetic coils or a superconducting magnet placed outside of the shielded enclosure to create said uniform magnetic field $H_0$.

9. The NMR spectroscopy system according to claim 1, wherein the magnetoresistive transducer has a C-shape or meander-shape and is connected to the two contacts.

10. A method for implementing the NMR spectroscopy system according to claim 1, comprising:

generating a magnetic field $H_0$ that is constant and uniform throughout the zone of interest in which the sample to be analysed and the transducer are placed;

regulating the position and/or the inclination of the transducer and the direction of the field $H_0$ to obtain orthogonality between $H_0$ and the plane of the layers of the transducer 101, said regulation being carried out using:

a test coil generating a field $H_T$, said field $H_T$ being perpendicular both to the field $H_0$ and to the field $H_1$;

regulating means arranged to ensure orthogonality between the field $H_0$ and the planar layers of the transducer;

generating the variable field $H_1$ that is uniform throughout the zone of interest in which the sample and the transducer are placed; and detecting signals of frequency $f_c-f_1$, $f_1-f_c$ or $f_c+f_1$, said signals being coherent and in phase with the signal at the supply frequency $f_c$ and the signal at the resonance frequency $f_1$.

* * * * *